United States Patent
Liu et al.

(10) Patent No.: US 11,448,691 B1
(45) Date of Patent: Sep. 20, 2022

(54) THERMAL SENSOR

(71) Applicant: Taiwan Semiconductor Manufacturing Company, Ltd., Hsinchu (TW)

(72) Inventors: Szu-Lin Liu, Hsinchu (TW); Jaw-Juinn Horng, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 17/238,762

(22) Filed: Apr. 23, 2021

(51) Int. Cl.
*G01R 31/28* (2006.01)
*G01R 1/04* (2006.01)

(52) U.S. Cl.
CPC ....... *G01R 31/2875* (2013.01); *G01R 1/0458* (2013.01)

(58) Field of Classification Search
CPC ............ G01R 31/2874; G01R 31/2875; G01R 31/2877
See application file for complete search history.

(56) References Cited

U.S. PATENT DOCUMENTS 6,347,636 B1 * 2/2002 Xia ................... H01L 21/67017
  134/1.1
2019/0331515 A1 * 10/2019 Smirnov ................... G01F 5/00

* cited by examiner

*Primary Examiner* — Tung X Nguyen
(74) *Attorney, Agent, or Firm* — Merchant & Gould P.C.

(57) ABSTRACT

A method of calibrating a thermal sensor device is provided. The method includes extracting an incremental voltage to temperature curve for a diode array from a first incremental voltage of the diode array at a first temperature. The diode array and a device under test (DUT) which includes a thermal sensor are heated. After heating the diode array, a first incremental temperature is determined from the incremental voltage to temperature curve for the diode array and a second incremental voltage of the diode array after heating the diode array. An incremental voltage to temperature curve is extracted for the DUT from the first incremental temperature, a first incremental voltage for the DUT at the first temperature, and a second incremental voltage of the DUT after heating the device under test. A temperature error for the thermal sensor is determined from the incremental voltage to temperature curve for the DUT.

20 Claims, 5 Drawing Sheets

THERMAL SENSOR

BACKGROUND

The semiconductor industry has experienced rapid growth due to improvements in the integration density of a variety of electronic components, such as transistors, diodes, resistors, capacitors, etc. This improvement in integration density has come from shrinking the semiconductor process node. As device dimensions shrink, voltage nodes also shrink, with core device voltages trending toward less than 1 Volt, and input/output (I/O) device voltages under 2 Volts. Temperature variation of device, such as transistor threshold voltage, is a concern as voltage nodes shrink. Temperature variation of device parameters, such as transistor threshold voltage, is a concern as voltage nodes shrink. For example, transistor threshold voltage may vary on the order of single millivolts per degree Celsius. Integrated circuits (ICs) are expected to operate in large temperature ranges, which correspond to large temperature variations that may be on the same order of magnitude as the device parameter. Therefore, characterization of circuit performance for temperature variation is increasingly important.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion. In addition, the drawings are illustrative as examples of embodiments of the invention and are not intended to be limiting.

DETAILED DESCRIPTION

Figure 1:
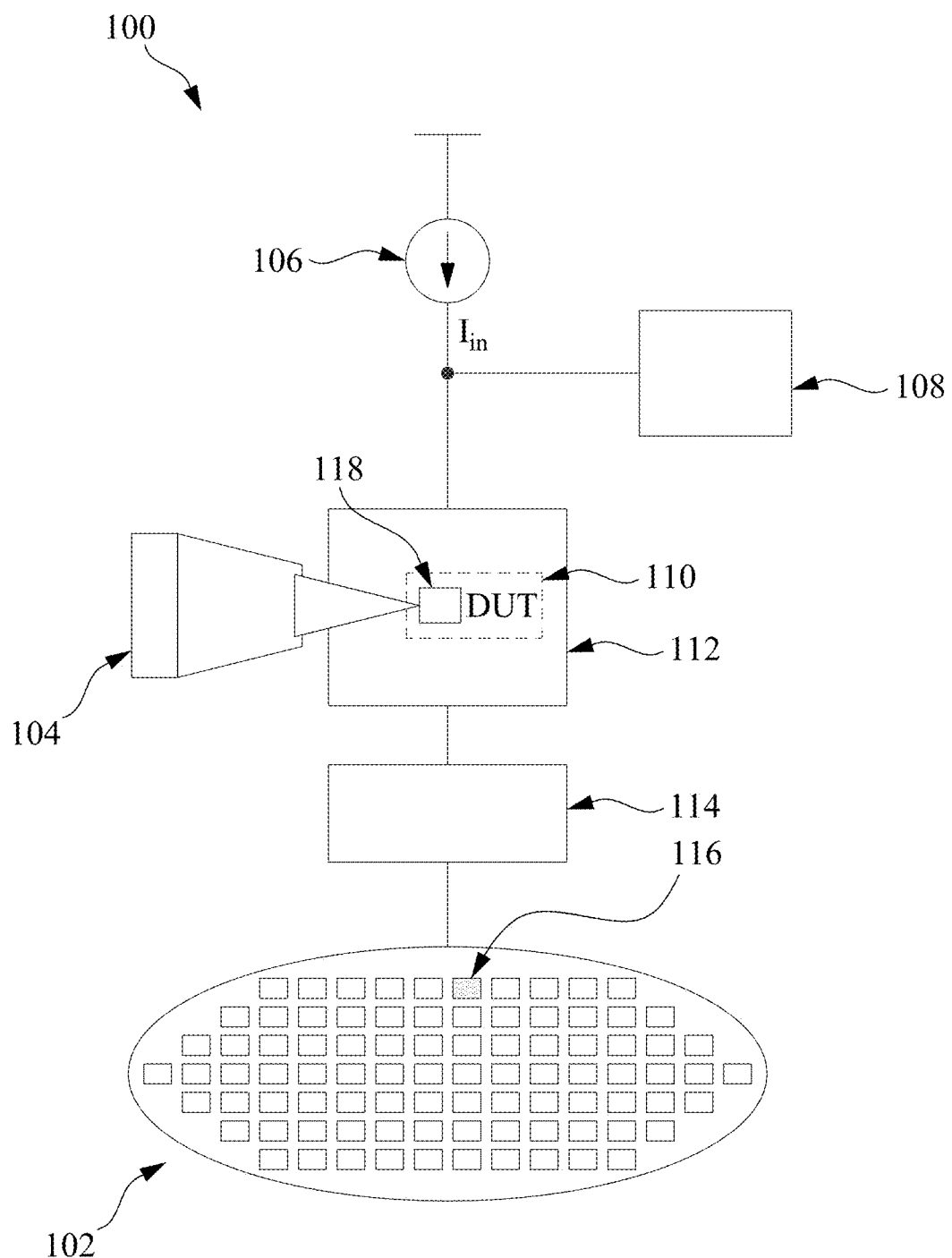
FIG. 1 is a diagram of an example test system in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Integrated Circuit (IC) performance is typically characterized for process, voltage, and temperature variation. Temperature variation characterization is generally performed by attaching a wafer to a thermal chuck, which heats and/or cools the wafer to specific temperatures for circuit performance characterization. Absolute temperature of the wafer heated by the thermal chuck is not perfectly uniform. For example, the thermal chuck may be set to heat the wafer to 50° C., but the wafer may have regions with temperatures ranging from 46° C. to 50° C. Thus, a temperature profile of the thermal chuck is typically obtained through use of a thermocouple prior to testing the wafer for circuit performance under temperature variation. The temperature profile may be obtained by heating/cooling the wafer to various temperatures (e.g., −25° C., 0° C., 25° C., 50° C., and 70° C.), allowing temperature of the wafer to stabilize for 30 minutes to one hour, then obtaining a number of temperature data points at positions distributed over the surface of the wafer. For example, five data points spread over the surface of the wafer may be obtained for each temperature.

Many problems arise when using the thermal profile obtained through the aforementioned process. For example, the thermal couple is not able to provide an accurate reading of the temperatures at the various data points. Moreover, during test, the wafer temperature is allowed to stabilize for 30 minutes to one hour before circuit performance at the test temperature can be characterized. This greatly inhibits throughput, as each test temperature requires the stabilization period, and anywhere from 5 to 8 (or more) test temperatures may be characterized. In addition, probe pitches change at different temperatures resulting in bad contact issues. Finally, distance from a temperature sensitive circuit under test to the nearest available data point on the thermal profile may be large, such that absolute temperature at the location of the circuit under test is hard to determine with any confidence.

The disclosure provides an improved test system and method to characterize a temperature accuracy of a thermal sensor of the test system at the room temperature. More specifically, the disclosure provides techniques for calibrating a thermal sensor of the test system. Through use of a diode array and a metal heater, temperature characteristics of the thermal sensor is monitored through a room temperature test. The disclosure further provides faster temperature settings without lifting a probe of the test system. In the disclosed techniques, temperature changing or temperature setting equipments may not be required. In addition, there is lesser probe contact time and easier for rechecking abnormal dies with flexibility of re-testing.

FIG. 1 is a diagram illustrating a wafer testing system 100 (simply referred to as a test system 100) in accordance with some embodiments. Test system 100 can be used to determine thermal characteristics of an integrated circuit or a portion of an integrated circuit at different temperatures. In some examples, test system 100 can be used to calibrate a thermal sensor being used to determine the thermal characteristics of an integrated circuit. As shown in FIG. 1, test system 100 includes a wafer 102, a probe 104, a current source 106, a voltage detector 108, a heater 114, a diode array 112, and a device under test 110.

Wafer 102 includes multiple integrated circuit dies 116 (or simply "dies 116"). Dies 116 are formed in and on the semiconductor wafer 102, and may include active circuits, passive circuits, and interconnect structures. A number of dies 116 in wafer 102 may depend on dimensions of each die 116 and wafer 102. In some examples, wafer 102 includes horizontal scribe lines and vertical scribe lines (not shown) which run between rows and columns of dies 116, respectively, and serve multiple purposes in fabrication of dies 116. For example, the scribe lines physically isolate individual dies 116 from each other, and provide a guideline for a diamond saw during singulation. Prior to singulation, the scribe lines may also be used for placement of test circuits for testing electrical and functional characteristics of the dies 116.

In some examples, each die 116 of wafer 102 may include a temperature sensing circuit 118 (also referred to as a temperature sensor 118 or a thermal sensor 118). Thermal sensor 118 can include a temperature sensing device, such as a temperature sensitive diode (also referred to as a thermal diode) formed integrally in wafer 102. In some examples, the temperature sensitive diode is formed at the same time as the circuits in dies 116 as part of the circuit fabrication process, or it can be formed in a separate fabrication process. The temperature sensitive diode operates such that, during operation, as it conducts current, a voltage drop across it varies with temperature in a known and characterized fashion. Hence, a measurement of the voltage drop across the temperature sensitive diode can be used to determine a current temperature of wafer 102.

Probe 104 is used to electrically test circuits on wafer 102 and is external to wafer 102. In some examples, probe 104 includes a probe head which is positioned such that a group of probers of probe 104 are brought into contact with predetermined contact points (for example, input terminals of temperature sensitive diodes), on individual circuits formed in die 116 of wafer 102. Probe 104 in conjugation with current source 106 and voltage detector 108 applies predetermined excitations to the predetermined contact points of die 116 and sense responses to the excitations. In some examples, thermal sensor 118 can be located in probe 104. In such examples, probe 104 determines a current temperature of wafer 102 through thermal sensor 118. In some examples, probe 104 may include a memory to store instructions and data, and a processor coupled to the memory and configured to execute the instructions stored on the memory.

Current source 106 is a direct current (DC) supply. In some examples, current source 106 is capable of providing at least two different currents, that is, a first current and a second current. In some examples, current source 106 provides the first current and then provides the second current. For example, current source 106 provides the first current, then after a predetermined time, provides the second current which is a multiple of the first current (for example, twice the first current). In some examples, the second current may be any multiple of the first current, and is not limited to integer multiples. And, the order of inputting the first current and the second current may be reversed. In some examples, current source 106 provides the first current and the second current to die 116 of wafer 102. For example, current source 106 provides the first current and the second current to die 116 of wafer 102 through one or more current pads associated with die 116. In some other examples, current source 106 provides the first current and the second current to die 116 of wafer 102 through probe 104.

Voltage detector 108 senses the voltage response of die 116 during testing. In some examples, voltage detector 108 draws little to no current when measuring the voltage response, so as not to affect current flow set up by current source 106. Voltage detector 108 detects a first voltage (e.g., $V_1$) while the first current is inputted by current source 106, and further detects a second voltage (e.g., $V_2$) while the second current is inputted by current source 106. Then, an incremental voltage ($\Delta V$) can be calculated as $V_2-V_1$. In some examples, voltage detector 108 determines the incremental voltage ($\Delta V$) as $V_2-V_1$. In some examples, voltage detector 108 senses the first voltage and the second voltage from die 116 of wafer 102 through one or more voltage pads associated with die 116. In some other examples, voltage detector 108 senses the first voltage and the second voltage from die 116 of wafer 102 through probe 104.

Device under test 110 (also referred to as DUT 110) is a selected die 116 of wafer 102. In some examples, die 116 is randomly selected from wafer 102. In some example, some dies 116 of wafer 102 are pre-marked to be used during testing of wafer 102. In some other examples, a predetermined number of dies 116 of wafer 102 are selected (for example, randomly selected one fourth of total number of dies 116). In other examples, every die 116 of wafer 102 is selected.

Figure 2A:
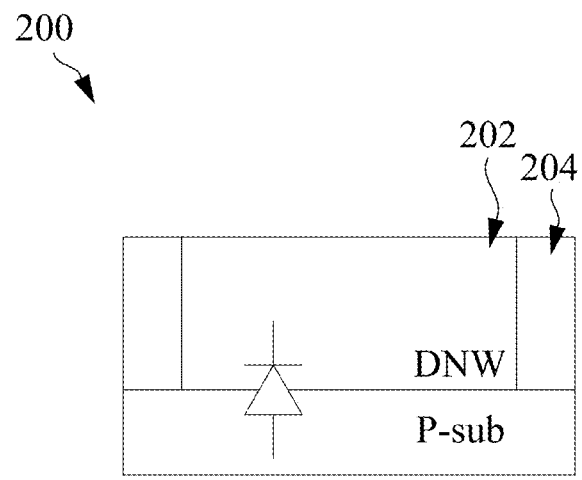
FIG. 2A is a diagram of an example diode in accordance with some embodiments.

Diode array 112 includes an array of a plurality of diodes. In some examples, diode array 112 includes an array of a predetermined number of deep n-well (DNW) diodes. FIG. 2A illustrates an example DNW diode 200 of diode array 112 in accordance with some embodiments. As shown in FIG. 2A, an example diode 200 of diode array 112 includes a p-substrate 204 with a deep n-well (DNW) 202 channel formed in p-substrate 204. Thus, DNW diode 200 is formed between p-substrate 204 and DNW 202 channel.

Figure 2B:
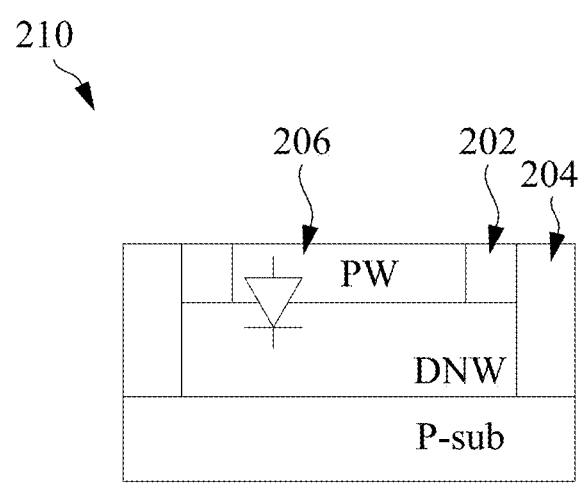
FIG. 2B is a diagram of another example diode in accordance with some embodiments.

In some examples, diode array 112 includes an array of a predetermined number of a bipolar junction transistors (BJTs) in diode connected configuration. FIG. 2B illustrates another example diode 250 which is a BJT in diode connected configuration in accordance with some embodiments. As shown in FIG. 2B, diode 250 includes a p-substrate 204 with a DNW 202 channel formed in p-substrate 204. In addition, a p-well (PW) 206 channel is formed in DNW 202 channel. Thus, DNW diode 250 is formed between PW 206 channel and DNW 202 channel.

In some examples, diode array 112 provides a well-defined relationship between an incremental voltage ($\Delta V$) and temperature (T). For example, a temperature dependence relationship of diode array 112 and temperature is provided by the following equation:

$$\Delta V_{BE} = \frac{KT}{q} \times \ln\left(\frac{I_{C1}}{I_{C2}}\right) \quad (1)$$

where $\Delta V_{BE}$ is an incremental bandgap voltage of diode array 112, K is Boltman's constant, T is temperature in Kelvins, q is charge on an electron, and $I_{c1}$ and $I_{c2}$ are two different currents. Solving for temperature, the following equation is obtained from equation (1):

$$T = \frac{\Delta V_{BE} \times q}{K \ln(N)} \quad (2)$$

where N is a ratio of $I_{c1}$ to $I_{c2}$.

Thus, diode array 112 provides a near ideal linearity with an intersection at 0° K and a negligible temperature error. Therefore, an incremental voltage to temperature (that is, $\Delta V$ to T) curve is obtained for diode array 112 by room-temperature measurements of the incremental voltage ($\Delta V$) and the temperature (T). In some examples, die-to-die variations in the temperature is eliminated by increasing diode area. For example, diode area is increased to 50 GP×50 GP where GP is a gate pitch to eliminate die-to-die variations in the temperature.

Heater 114, also referred to as a temperature control system, provides heating to device under test 110 and diode array 112. That is, heater 114 can raise or lower a temperature of both DUT 110 and diode array 112. For example, heater 114 is placed in proximity of device under test 110 and diode array 110.

Figure 3:
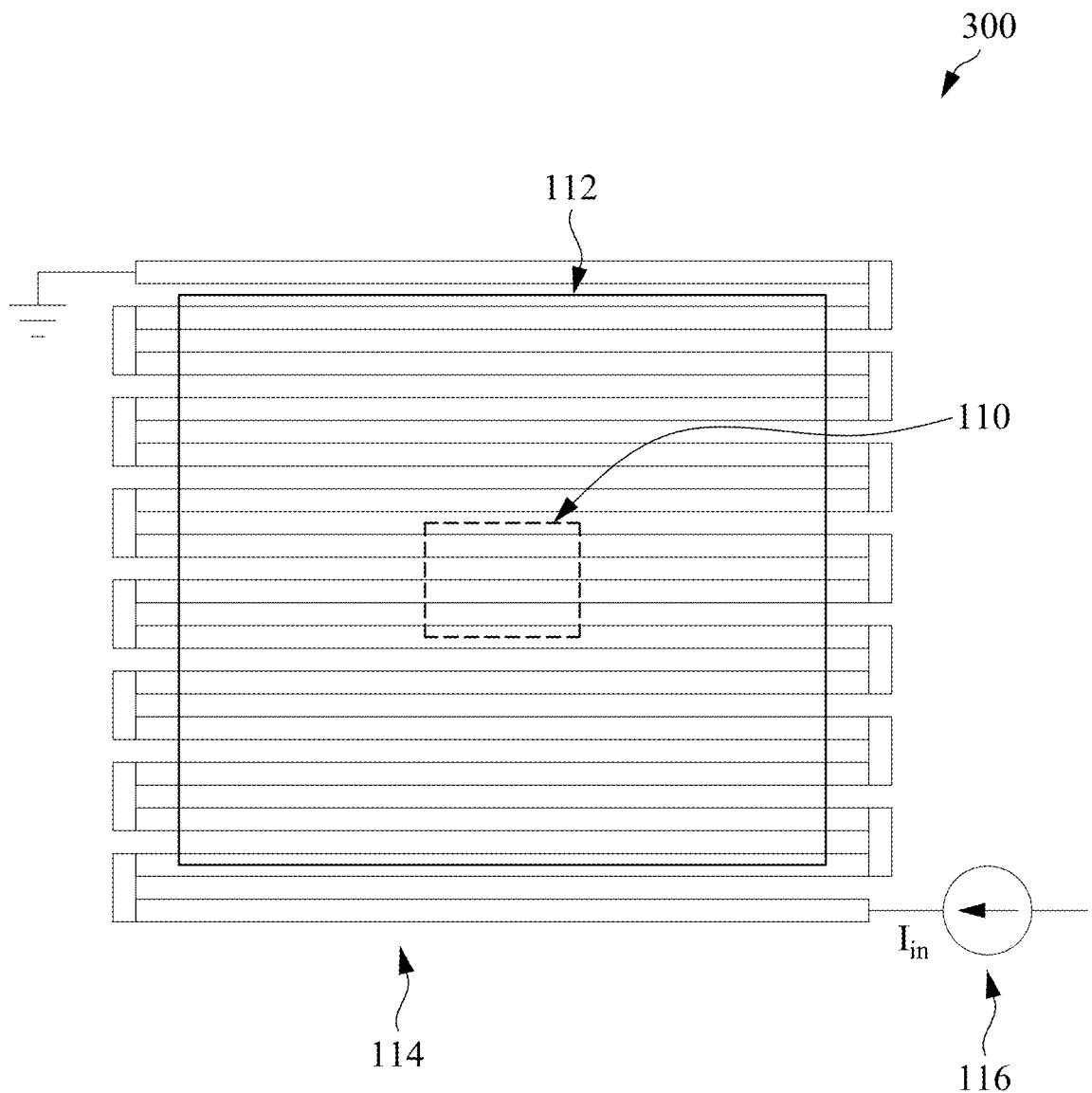
FIG. 3 is diagram illustrating example placement of elements of test system in accordance with some embodiments.

FIG. 3 illustrates an example placement 300 of device under test 110, diode array 112, and heater 114. As shown in FIG. 3, heater 114 is placed between device under test 110 and diode array 112. Thus, heater 114 provides an uniform heating of both device under test 110 and diode array 112. A heater current source $I_h$ 106 is connected to heater 114. For example, heater current source $I_h$ 106 is connected to a first terminal of heater 114 and a second terminal of heater 114 is connected to ground.

As shown in FIG. 3, heater 114 includes a plurality of connected metal strips which generate heat when heater current source $I_h$ 106 is passed through it. In some examples, an amount of heat generated by heater 114 is controlled by controlling an amount of current provided to heater 114 by heater current source $I_h$ 106 . Hence, heater current source $I_h$ 106 is increased to increase the amount of heat produced by heater 114 and is decreased to decrease the amount of heat produced by heater 114. In some examples, increasing the amount of heat produce by heater 114 increases a temperature of both device under test 110 and diode array 112. Similarly, decreasing the amount of heat produced by heater 114 decreases a temperature of both device under test 110 and diode array 112. Therefore, a temperature of both device under test 110 and diode array 112 is changed by varying heater current source In 106. In some examples, an area of heater 114 is greater than an area of diode array 112 which is greater than an area of device under test 110. A number of metal strips and a dimension of each metal strips of heater 114 is configurable.

In example embodiments, both device under test 110 and diode array 112 can be heated to a temperature of greater than 300° C. which covers a thermal sensor usage range. In addition, heater 114 provides a uniform temperature distribution in a heating region because it contains a plurality of metal plates which have a good thermal conductance. In some examples, heater 114 is an on-die metal heater. In some other examples, heater 114 is formed using MD or gate resistors on diode array 112. Heater 114 has electromagnetic tolerance for a current of greater than 2000 mA.

Figure 4:
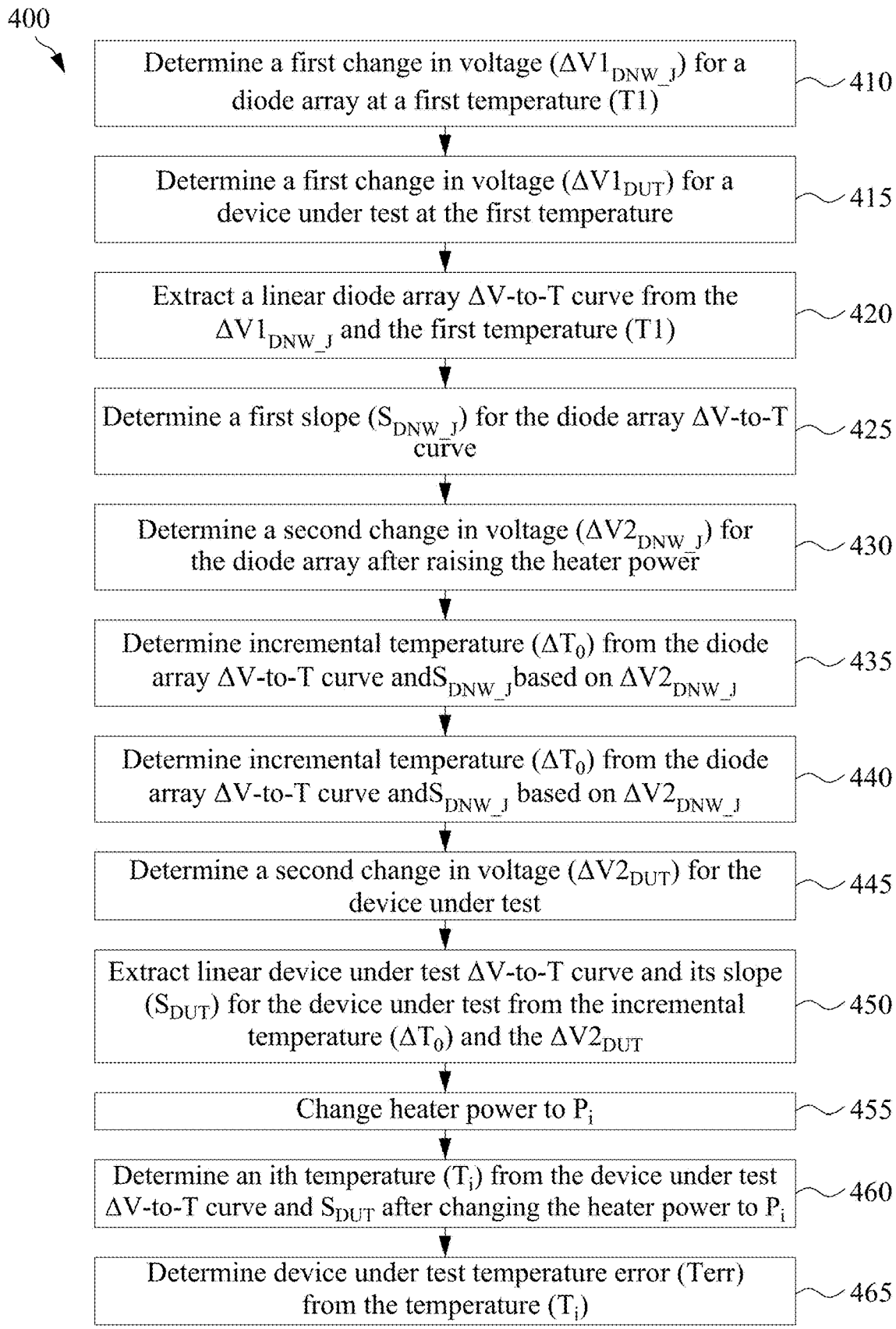
FIG. 4 illustrates a process flow for the method for calibrating a test system in accordance with some embodiments.

FIG. 4 is a flow diagram of a method 400 for calibrating a thermal sensor 118 used for determining thermal characteristics of an integrated circuit in accordance with some embodiments. Method 400 is described in terms of test system 100 shown in FIGS. 1-3. The calibration process may be used to determine a temperature error of thermal sensor 118 and hence provide a more accurate measurement of a current temperature of device under test 110. In some examples, method 400 can be performed by probe 104. In some other examples, method 400 can be performed by a processing system described with reference to FIG. 6 of the disclosure. In other examples, method 400 can be stored as instructions in a storage device accessible to a processor. The stored instructions can be executed by the processor to perform method 400. The storage device to store the instructions can include a non-transitory computer readable medium.

At block 410 of method 400, a first incremental voltage ($\Delta V1_{DNW\_J}$) for a diode array is determined at a first temperature (T1). For example, the $\Delta V1_{DNW\_J}$ for diode array 112 is determined at a room temperature. The $\Delta V1_{DNW\_J}$ for diode array 112 at the room temperature can be determined by applying the first current and the second current by current source 106 and determining the $\Delta V1_{DNW\_J}$ by voltage detector 108 as a response to the first current and the second current.

For example, a first current is inputted to diode array 112. The first current may be inputted by current source 106. The first current injection may be controlled by an operator, and/or by automatic test equipment including current source 106 and a controller, for example. The first current inputted in diode array 112 may be on the order of microamperes, such as in a range of about 2 microamperes to 20 microamperes. Other ranges for the first current are also contemplated herein.

The first current injected by current source 106 sets up a first voltage across diode array 112, and the first voltage is measured as the first current is flowing through diode array 112. The first voltage may be read by voltage detector 108. The first current may be allowed to stabilize before the first voltage is read. The first voltage read out by voltage detector 108 may be stored.

After reading the first voltage, a second current is inputted to diode array 112 by current source 106. In some examples, the first current may be turned off prior to inputting the second current. The second current may be inputted to diode array 112 by current source 106. The second current may be a multiple of the first current, or the second current may be a fraction of the first current. Magnitude of the second current may be on the order of microamperes, such as in a range of about 2 microamperes to about 20 microamperes, for example. Other ranges for the second current are also contemplated herein. In some examples, a ratio of the second current to the first current may be ⅒, ½, 2, 10, or the like.

While keeping the second current flowing through diode array 112, a second voltage of the diode array 112 may be measured by voltage detector 108. The second current injected by current source 106 sets up the second voltage across diode array 112. The second voltage may be read by voltage detector 108. The second current may be allowed to stabilize before the second voltage is read. The second voltage read out by voltage detector 108 may be stored. Then a difference between the second voltage corresponding to the first current and the first voltage corresponding to the second current is determined to determine the $\Delta V1_{DNW\_J}$ for diode array 112.

At block 415 of method 400, a first incremental voltage ($\Delta V1_{DUT}$) for a device under test is determined at a first temperature (T1). For example, the $\Delta V1_{DUT}$ for device under test 110 is determined at a room temperature. The $\Delta V1_{DUT}$ for device under test 110 at the room temperature can be determined by applying the first current and the second current by current source 106 and determining the $\Delta V1_{DUT}$ by voltage detector 108 as a response to the first current and the second current.

Figure 5:
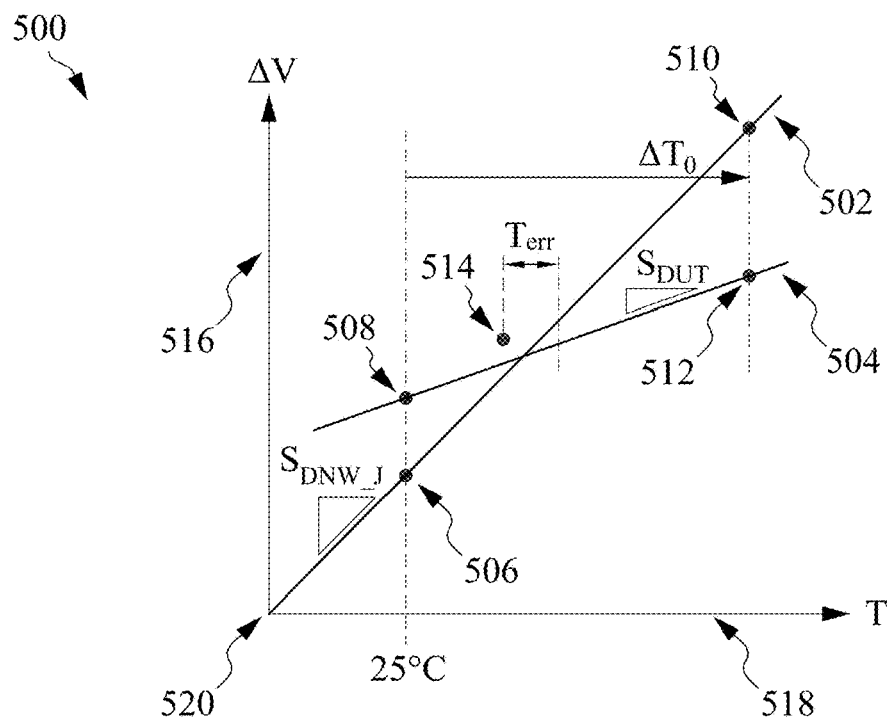
FIG. 5 illustrates an example graph illustrating AV-to-T curves of the test system in accordance with some embodiments.

At block 420 of method 400, a linear diode array $\Delta V$-to-T curve is extracted from the first incremental voltage ($\Delta V1_{DNW\_J}$) and the first temperature (T1) for the diode array 112. For example, the $\Delta V1_{DNW\_J}$ and T1 can be plotted on a graph having an incremental voltage axis (that is, $\Delta V$ axis) and a temperature axis (that is, T axis). FIG. 5 illustrates a graph 500 having $\Delta V$ axis and a T axis. For example, and as shown in FIG. 5, graph 500 includes $\Delta V$ axis 516 and a T axis 518. A first point 506 representing ($\Delta V1_{DNW\_J}$, T1) of diode array 112 is plotted in graph 500. First point 506 is then connected with origin point 520 representing (0,0) of graph 500 to extract linear diode array $\Delta V$-to-T curve 502. In addition, and as shown in graph 500, a second point 508 representing ($\Delta V1_{DUT}$, T1) of device under test 110 is also plotted in graph 500.

At block 425 of method 400, a first slope ($S_{DNW\_J}$) for the diode array $\Delta V$-to-T curve is determined. For example, the first slope ($S_{DNW\_J}$) for diode array $\Delta V$-to-T curve 502 is determined. In some examples, the first slope ($S_{DNW\_J}$) is determined by dividing a difference in the y-coordinates of first point 506 representing ($\Delta V1_{DNW\_J}$, T1) and origin 520 representing (0,0) of diode array $\Delta V$-to-T curve 502 by a difference in the x-coordinates of first point 506 representing ($\Delta V1_{DNW\_J}$, T1) and origin 520 representing (0,0). In some examples, origin 520 is an intersection point of the incremental voltage axis (that is, $\Delta V$ axis 516) and the temperature axis (that is, T axis 518).

At block 430 of method 400, heater power is raised, for example, to Po. In some examples, the power of heater 114 is raised to PO by raising a heater current $I_h$. Raising the heater current In increases an amount of heat being generated by heater 114. This leads to increase in the temperature of both device under test 110 and diode array 112. For example, the temperature of both device under test 110 and diode array 112 may increase to a second temperature T2 from the first temperature T1. In some examples, the heater current In is increased by a predetermined amount.

At block 435 of method 400, a second incremental voltage ($\Delta V2_{DNW\_J}$) for the diode array 112 is determined after heating diode array 112. For example, the $\Delta V2_{DNW\_J}$ for diode array 112 after heating can be determined by applying the first current and the second current by current source 106 and determining the $\Delta V2_{DNW\_J}$ by voltage detector 108 as a response to the first current and the second current. In some examples, a temperature of diode array 112 may be allowed to stabilize before the $\Delta V2_{DNW\_J}$ is determined.

At block 440 of method 400, a first incremental temperature ($\Delta T_0$) is determined from diode array $\Delta V$-to-T curve 502 and the first slope ($S_{DNW\_J}$) based on the $\Delta V2_{DNW\_J}$. For example, from the first slope ($S_{DNW\_J}$) and the $\Delta V2_{DNW\_J}$, the second temperature (T2) is determined. A third point 510 representing ($\Delta V2_{DNW\_J}$, T2) is then plotted in graph 500 and diode array $\Delta V$-to-T curve 502 is extended from first point 506 representing ($\Delta V1_{DNW\_J}$, T1) to third point 510 representing ($\Delta V2_{DNW\_J}$, T2). The incremental temperature ($\Delta T_0$) is extracted using extended diode array $\Delta V$-to-T curve 502.

At block 445 of method 400, a second incremental voltage ($\Delta V2_{DUT}$) for device under test 110 is determined after heating device under test 110. For example, the $\Delta V2_{DUT}$ for device under test 110 is determined by applying the first current and the second current by current source 106 and determining the $\Delta V2_{DUT}$ by voltage detector 108 as a response to the first current and the second current.

At block 450 of method 400, linear device under test $\Delta V$-to-T curve 504 is extracted and a second slope ($S_{DUT}$) for device under test 110 is determined from the first incremental temperature ($\Delta T_0$) and the $\Delta V2_{DUT}$. For example, a fourth point 512 representing ($\Delta V2_{DUT}$, T2) is plotted on graph 500. Fourth point 512 representing ($\Delta V2_{DUT}$, T2) is joined with second point 508 representing ($\Delta V1_{DUT}$, T1) using a straight line to extract linear device under test $\Delta V$-to-T curve 504. Then the second slope ($S_{DUT}$) for the extract linear device under test $\Delta V$-to-T curve 504 is determined. In some examples, the second slope ($S_{DUT}$) is determined by dividing a difference in the y-coordinates of fourth point 512 representing ($\Delta V2_{DUT}$, T2) and second point 508 representing ($\Delta V1_{DUT}$, T1) of device under test $\Delta V$-to-T curve 504 by a difference in the x-coordinates of fourth point 512 representing ($\Delta V2_{DUT}$, T2) and second point 508 representing ($\Delta V1_{DUT}$, T1).

At block 455 of method 400, the heater power is changed again, for example, to $P_i$. In some examples, the power of heater 114 is changed to $P_i$ by changing the heater current $I_h$. Changing the heater current In changes an amount of heat being generated by heater 114. This leads to change in a temperature of both device under test 110 and diode array 112. For example, the temperature of both device under test 110 and diode array 112 may change to an ith temperature ($T_i$) from a previous temperature (for example, the second temperature (T2)). In some examples, the heater current In is changed by a predetermined amount.

At block 460 of method 400, an ith temperature ($T_i$) is determined from the device under test $\Delta V$-to-T curve and the second slope ($S_{DUT}$) after changing the heater power to $P_i$. For example, after changing heater 114 power to $P_i$, an ith incremental voltage ($\Delta Vi_{DUT}$) is determined by applying the first current and the second current by current source 106 and determining the $\Delta Vi_{DUT}$ by voltage detector 108 as a response to the first current and the second current. Then, from the second slope ($S_{DUT}$) and the $\Delta Vi_{DUT}$, the ith temperature (Ti) is determined. In some examples, a fifth point 514 representing ($\Delta Vi_{DUT}$, Ti) may be plotted in graph 500.

At block 465 of method 400, thermal sensor temperature error (Terr) is determined from the ith temperature ($T_i$). For example, a difference between the ith temperature ($T_i$) determined from the device under test $\Delta V$-to-T curve 504 and the second slope ($S_{DUT}$), and a temperature provided thermal sensor 118 is determined to determine the thermal sensor temperature error (Terr). In some examples, the thermal sensor temperature error (Terr) can be determined for a multiple heater settings. The thermal sensor temperature error (Terr) may not be linearly correlated over temperature. Therefore, calibration parameters, that is, the thermal sensor temperature error (Terr), correlating the $\Delta Vi_{DUT}$ to temperature may be stored in a lookup table, or a calibration equation may be derived so that the temperature reading outputted by thermal sensor 118 may be calibrated on the fly.

Figure 6:
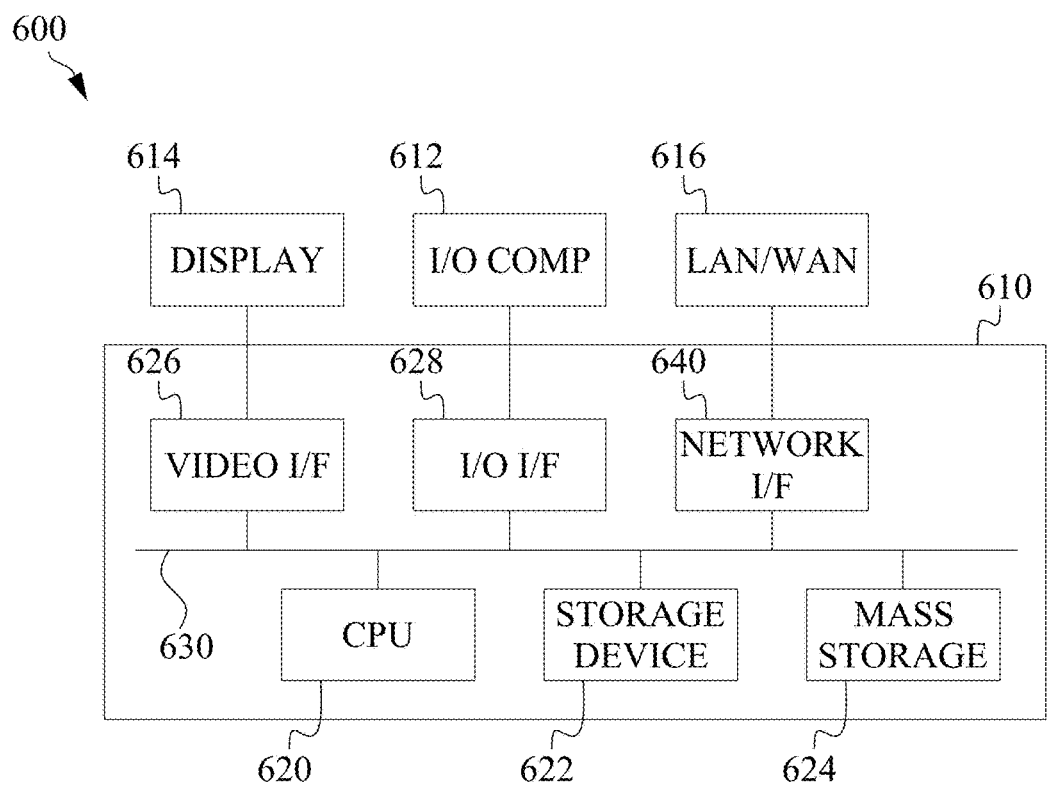
FIG. 6 is a block diagram illustrating an example of a processing system in accordance with some embodiments.

FIG. 6 is a block diagram illustrating an example of a processing system 600 in accordance with some embodiments disclosed herein. Processing system 600 may be used to calibrate a thermal sensor device used for determining thermal characteristics of an integrated circuit in accordance with various processes discussed herein. Processing system 600 includes a processing unit 610, such as a desktop computer, a workstation, a laptop computer, a dedicated unit customized for a particular application, a smart phone or tablet, etc. Processing system 600 may be equipped with a display 614 and one or more input/output devices 612, such as a mouse, a keyboard, touchscreen, printer, etc. Processing unit 610 also includes a central processing unit (CPU) 620, storage device 622, a mass storage device 624, a video adapter 626, and an I/O interface 628 connected to a bus 630.

The bus 630 may be one or more of any type of several bus architectures including a memory bus or memory controller, a peripheral bus, or video bus. CPU 620 may comprise any type of electronic data processor, and storage device 622 may comprise any type of system memory, such as static random access memory (SRAM), dynamic random access memory (DRAM), or read-only memory (ROM).

Mass storage device 624 may comprise any type of storage device configured to store data, programs, and other information and to make the data, programs, and other information accessible via bus 630. Mass storage device 624 may comprise, for example, one or more of a hard disk drive, a magnetic disk drive, an optical disk drive, flash memory, or the like.

The term computer readable media as used herein may include computer storage media such as the system memory and storage devices mentioned above. Computer storage media may include volatile and nonvolatile, removable and non-removable media implemented in any method or technology for storage of information, such as computer readable instructions, data structures, or program modules. Storage device 622 and mass storage device 624 are computer storage media examples (e.g., memory storage).

Computer storage media may include RAM, ROM, electrically erasable read-only memory (EEPROM), flash memory or other memory technology, CD-ROM, digital versatile disks (DVD) or other optical storage, magnetic cassettes, magnetic tape, magnetic disk storage or other magnetic storage devices, or any other article of manufacture which can be used to store information and which can be accessed by processing device 600. Any such computer storage media may be part of processing device 600. Computer storage media does not include a carrier wave or other propagated or modulated data signal.

Communication media may be embodied by computer readable instructions, data structures, program modules, or other data in a modulated data signal, such as a carrier wave or other transport mechanism, and includes any information delivery media. The term "modulated data signal" may describe a signal that has one or more characteristics set or changed in such a manner as to encode information in the signal. By way of example, and not limitation, communication media may include wired media such as a wired network or direct-wired connection, and wireless media such as acoustic, radio frequency (RF), infrared, and other wireless media.

Video adapter 626 and I/O interface 628 provide interfaces to couple external input and output devices to processing unit 610. As illustrated in FIG. 6, examples of input and output devices include display 614 coupled to video adapter 626 and I/O device 612, such as a mouse, keyboard, printer, and the like, coupled to I/O interface 628. Other devices may be coupled to processing unit 610, and additional or fewer interface cards may be utilized. For example, a serial interface card (not shown) may be used to provide a serial interface for a printer. Processing unit 610 also may include a network interface 640 that may be a wired link to a local area network (LAN) or a wide area network (WAN) 616 and/or a wireless link.

Embodiments of processing system 600 may include other components. For example, processing system 600 may include power supplies, cables, a motherboard, removable storage media, cases, and the like. These other components, although not shown, are considered part of processing system 600.

In some examples, instructions or software code is executed by CPU 620 to perform refresh operations. The instructions or the software code may be accessed by CPU 620 via bus 630 from storage device 622, mass storage device 624, or the like, or remotely through network interface 640. Further, in some examples, the refresh operations instructions may be received though I/O interface 628 and/or stored in storage device 622 or mass storage device 624 in accordance with various methods and processes implemented by the software code.

In accordance with example embodiments, a method of calibrating a thermal sensor device, the method comprising: extracting an incremental voltage to temperature curve for a diode array from a first incremental voltage of the diode array at a first temperature; heating the diode array and a device under test, wherein the device under test includes a thermal sensor; determining, after heating the diode array, a first incremental temperature from the incremental voltage to temperature curve for the diode array and a second incremental voltage of the diode array after heating the diode array; extracting an incremental voltage to temperature curve for the device under test from the first incremental temperature, a first incremental voltage for the device under test at the first temperature, and a second incremental voltage of the device under test after heating the device under test; and determining a temperature error for the thermal sensor from the incremental voltage to temperature curve for the device under test.

In example embodiments of the disclosure, an apparatus for calibrating a thermal sensor comprises: a memory device storing instructions for calibrating a thermal sensor; and a processor connected to the memory device, wherein the processor is operative to execute the instructions, wherein, when executed, the instructions cause to: determine a first incremental voltage for a diode array at a first temperature; determine a first incremental voltage for a device under test at the first temperature, the device under test comprising the thermal sensor operative to determine a temperature of the device under test; determine a first slope from the first incremental voltage of the diode array; heat both the diode array and the device under test; determine a second incremental voltage for the diode array after heating the diode array; determine a first incremental temperature based on the second incremental voltage for the diode array and the first slope; determine a second incremental voltage for the device under test after heating the device under test; determine a second slope from the second incremental voltage for the device under test and the first change in temperature; and determine a temperature error for the thermal sensor based on the second slope.

In accordance with example embodiments, a calibration system for calibrating a thermal sensor, the calibration system comprising: a diode array; a heater placed between the diode array and a device under test; a probe operative to: extract an incremental voltage to temperature curve for the diode array from a first incremental voltage of the diode array at a first temperature; determine, after heating the diode array using the heater, a first incremental temperature from the incremental voltage to temperature curve for the diode array and a second incremental voltage of the diode array after heating the diode array; extract an incremental voltage to temperature curve for the device under test from the first incremental temperature, a first incremental voltage for the device under test at the first temperature, and a second incremental voltage of the device under test after heating the device under test; and determine a temperature error for a thermal sensor of the device under test from the incremental voltage to temperature curve for the device under test.

This disclosure outlines various embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of calibrating a thermal sensor device, the method comprising:
   extracting an incremental voltage to temperature curve for a diode array from a first incremental voltage of the diode array at a first temperature;
   heating the diode array and a device under test, wherein the device under test includes a thermal sensor;
   determining, after heating the diode array, a first incremental temperature from the incremental voltage to temperature curve for the diode array and a second incremental voltage of the diode array after heating the diode array;
   extracting an incremental voltage to temperature curve for the device under test from the first incremental temperature, a first incremental voltage for the device under test at the first temperature, and a second incremental voltage of the device under test after heating the device under test; and
   determining a temperature error for the thermal sensor from the incremental voltage to temperature curve for the device under test.

2. The method of claim 1, further comprising:
   determining the first incremental voltage of the diode array at the first temperature; and
   determining the first incremental voltage for the device under test at the first temperature.

3. The method of claim 1, wherein extracting the incremental voltage to temperature curve for the diode array comprises:
   plotting the first incremental voltage for the diode array at the first temperature as a first point in a graph comprising an incremental voltage axis and a temperature axis; and
   joining the first point to an intersection point of the incremental voltage axis and the temperature axis.

4. The method of claim 1, wherein determining the first incremental temperature comprises:
   determining a second temperature of the diode array from the second incremental voltage and a first slope of the incremental voltage to temperature curve for the diode array; and
   determining the first incremental temperature as a difference between the second temperature and the first temperature.

5. The method of claim 1, wherein extracting the incremental voltage to temperature curve for the device under test comprises:
   plotting the first incremental voltage for the device under test at the first temperature as a second point in a graph comprising an incremental voltage axis and a temperature axis;
   plotting the second incremental voltage for the device under test at the first incremented temperature as a third point in the graph; and
   joining the second point and the third point.

6. The method of claim 1, wherein determining the temperature error for the thermal sensor comprises:
   determining a third incremental voltage for the device under test after reheating the device under test;
   determining a third temperature of the device under test after reheating the device under test from a second slope of the incremental voltage to temperature curve for the device under test and the third incremental voltage of the device under test; and
   determining a difference between the third temperature and a temperature reading of the thermal sensor.

7. The method of claim 1, wherein determining the temperature error for the thermal sensor comprises determining the temperature error for multiple temperatures of the device under test.

8. The method of claim 1, wherein heating the diode array and the device under test comprises heating the diode array and the device under test with a metallic heater.

9. The method of claim 1, wherein heating the diode array and the device under test comprises heating the diode array and the device under test with a metallic heater, wherein the metallic heater is place between the device under test and the diode array.

10. The method of claim 1, wherein extracting the incremental voltage to temperature curve for the diode array comprises extracting the incremental voltage to temperature curve for the diode array comprising a plurality of deep n-well diodes.

11. The method of claim 1, wherein extracting the incremental voltage to temperature curve for the device under test comprises extracting the incremental voltage to temperature curve for the device under test comprising a die of a wafer.

12. An apparatus for calibrating the thermal sensor, the apparatus comprising:
   a memory device storing instructions for calibrating the thermal sensor; and
   a processor connected to the memory device, wherein the processor is operative to execute the instructions, wherein, when executed, the instructions cause to:
      determine a first incremental voltage for a diode array at a first temperature;
      determine a first incremental voltage for a device under test at the first temperature, the device under test comprising the thermal sensor operative to determine a temperature of the device under test;
      determine a first slope from the first incremental voltage of the diode array;
      heat both the diode array and the device under test;
      determine a second incremental voltage for the diode array after heating the diode array;
      determine a first incremental temperature based on the second incremental voltage for the diode array and the first slope;
      determine a second incremental voltage for the device under test after heating the device under test;

determine a second slope from the second incremental voltage for the device under test and the first change in temperature; and determine a temperature error for the thermal sensor based on the second slope.

13. The apparatus of claim 12, wherein the device under test is a die of a wafer.

14. The apparatus of claim 12, wherein the diode array comprises a plurality of deep n-well diodes.

15. The apparatus of claim 12, wherein the diode array and the device under test are heated using a metallic heater, and wherein the metallic heater is placed between the device under test and the diode array.

16. The apparatus of claim 12, wherein the instructions causing to determine the temperature error for the thermal sensor comprises the instructions causing to:

reheat the device under test;

determine a third incremental voltage for the device under test after reheating the device under test;

determine a third temperature of the device under test after reheating the device under test from the second slope of the incremental voltage to temperature curve for the device under test and the third incremental voltage of the device under test; and determine a difference between the third temperature and a temperature reading of the thermal sensor.

17. A calibration system for calibrating a thermal sensor, the calibration system comprising:

a diode array;

a heater placed between the diode array and a device under test;

a probe operative to:

extract an incremental voltage to temperature curve for the diode array from a first incremental voltage of the diode array at a first temperature;

determine, after heating the diode array using the heater, a first incremental temperature from the incremental voltage to temperature curve for the diode array and a second incremental voltage of the diode array after heating the diode array;

extract an incremental voltage to temperature curve for the device under test from the first incremental temperature, a first incremental voltage for the device under test at the first temperature, and a second incremental voltage of the device under test after heating the device under test; and determine a temperature error for a thermal sensor of the device under test from the incremental voltage to temperature curve for the device under test.

18. The calibration system of claim 17, wherein the diode array comprising a plurality of deep n-well diodes.

19. The calibration system of claim 17, wherein the probe being operative to determine the temperature error for the thermal sensor comprises the probe being operative to determine the temperature error for multiple temperatures of the device under test.

20. The calibration system of claim 17, wherein the device under test is a die of a wafer.

* * * * *